(12) United States Patent
Mandewalkar

(10) Patent No.: US 12,095,376 B2
(45) Date of Patent: Sep. 17, 2024

(54) POWER SUPPLY UNIT, SYSTEM AND METHOD FOR ELECTRICAL COALESCENCE OF MULTI-PHASE LIQUID MIXTURESFIELD

(71) Applicant: Schlumberger Technology Corporation, Sugar Land, TX (US)

(72) Inventor: Pavan Kumar B. Mandewalkar, Houston, TX (US)

(73) Assignee: CAMERON INTERNATIONAL CORPORATION, Houston, TX (US)

( * ) Notice: Subject to any disclaimer, the term of this patent is extended or adjusted under 35 U.S.C. 154(b) by 236 days.

(21) Appl. No.: 17/759,007

(22) PCT Filed: Jan. 18, 2021

(86) PCT No.: PCT/US2021/013843
§ 371 (c)(1),
(2) Date: Jul. 18, 2022

(87) PCT Pub. No.: WO2021/150464
PCT Pub. Date: Jul. 29, 2021

(65) Prior Publication Data
US 2023/0037114 A1 Feb. 2, 2023

Related U.S. Application Data

(60) Provisional application No. 62/963,763, filed on Jan. 21, 2020.

(51) Int. Cl.
*H02M 3/335* (2006.01)
*B01D 17/06* (2006.01)
(Continued)

(52) U.S. Cl.
CPC ........ *H02M 3/33573* (2021.05); *B01D 17/06* (2013.01); *B03C 11/00* (2013.01); *C10G 33/02* (2013.01)

(58) Field of Classification Search
CPC .......... H02M 3/00; H02M 3/33; H02M 3/335; H02M 3/3315; H02M 3/33571;
(Continued)

(56) References Cited

U.S. PATENT DOCUMENTS

| | | | |
|---|---|---|---|
| 3,939,395 | A | 2/1976 | Prestridge et al. |
| 4,204,934 | A | 5/1980 | Warren et al. |

(Continued)

FOREIGN PATENT DOCUMENTS

| | | |
|---|---|---|
| CN | 108686400 A | 10/2018 |
| CN | 107723020 B | 11/2019 |

(Continued)

OTHER PUBLICATIONS

Extended Search Report issued in European Patent Application No. 21743978.5 dated Jan. 29, 2024, 7 pages.
International Search Report and Written Opinion issued in the PCT Application PCT/US2021/013843 dated May 12, 2021 (10 pages).

*Primary Examiner* — Tuan T Dinh
(74) *Attorney, Agent, or Firm* — Jeffrey D. Frantz

(57) ABSTRACT

A power supply device includes a power conversion circuit configured to convert an input voltage into an output voltage, a controller, and an output switch. The controller is coupled to the power conversion circuit and configured to control the power conversion circuit to generate the output voltage for causing electrical coalescence of a multi-phase liquid mixture when the output voltage is applied to the multi-phase liquid mixture. The output switch is coupled between an output of the power conversion circuit and a terminal of the power supply device. The output switch is switchable among a first position at which the output of the power conversion circuit is coupled to the terminal, a second position at which the output of the power conversion circuit
(Continued)

is grounded, and a third position at which the output of the power conversion circuit is electrically isolated from the terminal and the ground.

20 Claims, 7 Drawing Sheets

(51) Int. Cl.
*B03C 11/00* (2006.01)
*C10G 33/02* (2006.01)

(58) Field of Classification Search
CPC .... H02M 3/33573; H02M 3/286; H02M 7/00; H02M 7/02; H02M 7/06; B01D 17/06; B01D 17/12; B03C 11/00; G01R 31/42
USPC .................................................. 361/271–272
See application file for complete search history.

(56) References Cited

U.S. PATENT DOCUMENTS

| | | | | |
|---|---|---|---|---|
| 4,400,253 | A * | 8/1983 | Prestridge | .............. B01D 17/06 |
| | | | | 204/555 |
| 6,860,979 | B2 * | 3/2005 | Sams | ...................... B03C 11/00 |
| | | | | 204/663 |
| 2017/0047743 | A1 * | 2/2017 | Toujinbara | ................. G05F 1/10 |
| 2017/0310000 | A1 * | 10/2017 | Gustavsson | .......... H04B 7/0456 |
| 2017/0358989 | A1 * | 12/2017 | Werner | ................... H02M 1/08 |
| 2018/0069485 | A1 * | 3/2018 | Hsiao | .................... H02M 3/285 |

FOREIGN PATENT DOCUMENTS

| | | |
|---|---|---|
| JP | 11276803 A | 10/1999 |
| WO | 9312856 A1 | 7/1993 |
| WO | 2021092009 A1 | 5/2021 |

* cited by examiner

POWER SUPPLY UNIT, SYSTEM AND METHOD FOR ELECTRICAL COALESCENCE OF MULTI-PHASE LIQUID MIXTURESFIELD

CROSS-REFERENCE TO RELATED APPLICATION

The present document is a National Stage Entry of International Application No. PCT/US2021/013843, filed Jan. 18, 2021, which is based on and claims priority to U.S. Provisional Application Ser. No. 62/963,763, filed Jan. 21, 2020, which is incorporated herein by reference in its entirety.

Embodiments of the present application generally relate to power supply units, systems and methods for electrical coalescence of multi-phase liquid mixtures. A practical application involves coalescence of water droplets in an oil/water multi-phase liquid mixture for separation of oil and water.

BACKGROUND

Separation of oil and water, especially when the fluid is a multi-phase liquid mixture with small droplets of water suspended in an oil base, is a common concern in the petroleum industry. A known technique for separating water from oil, using electrical coalescence is described in U.S. Pat. No. 6,860,979, which is incorporated by reference herein.

SUMMARY

In at least one embodiment, a power supply device comprises a power conversion circuit configured to convert an input voltage into an output voltage, a controller, and an output switch. The controller is coupled to the power conversion circuit and configured to control the power conversion circuit to generate the output voltage for causing electrical coalescence of a multi-phase liquid mixture when the output voltage is applied to the multi-phase liquid mixture. The output switch is coupled between an output of the power conversion circuit and a terminal of the power supply device. The output switch is switchable among a first position at which the output of the power conversion circuit is coupled to the terminal, a second position at which the output of the power conversion circuit is grounded, and a third position at which the output of the power conversion circuit is electrically isolated from the terminal and the ground.

In at least one embodiment, a system comprises a housing, a power conversion circuit, and an output switch. The power conversion circuit is accommodated in the housing, and configured to convert an input voltage into an output voltage for causing electrical coalescence of a multi-phase liquid mixture when the output voltage is applied to the multi-phase liquid mixture. The output switch includes fixed and moving contacts accommodated in the housing, and configured to connect or disconnect an output of the power conversion circuit and a terminal on an outer wall of the housing. The output switch further includes a physically movable handle exposed on the outer wall of the housing, and coupled to the moving contact for moving the moving contact relative to the fixed contact to switch the output switch between a load position at which the output of the power conversion circuit is coupled to the terminal, and a no-load position at which the output of the power conversion circuit is electrically isolated from the terminal and the ground.

In a method in accordance with at least one embodiment, a power conversion circuit accommodated in a housing generates an output voltage. The output voltage is supplied through an output switch, which is in a first position, to a terminal on an outer wall of the housing, and then through a cable, which is coupled to the terminal, to at least one electrode in a vessel to cause electrical coalescence of a multi-phase liquid mixture in the vessel upon application of the output voltage. In response to a physical movement of a handle of the output switch on the outer wall of the housing, the output switch is switched to a second position where the output of the power conversion circuit is electrically isolated from the terminal and from the ground, to electrically isolate the power conversion circuit from the at least one electrode in the vessel while the cable remains connected between the terminal and the at least one electrode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
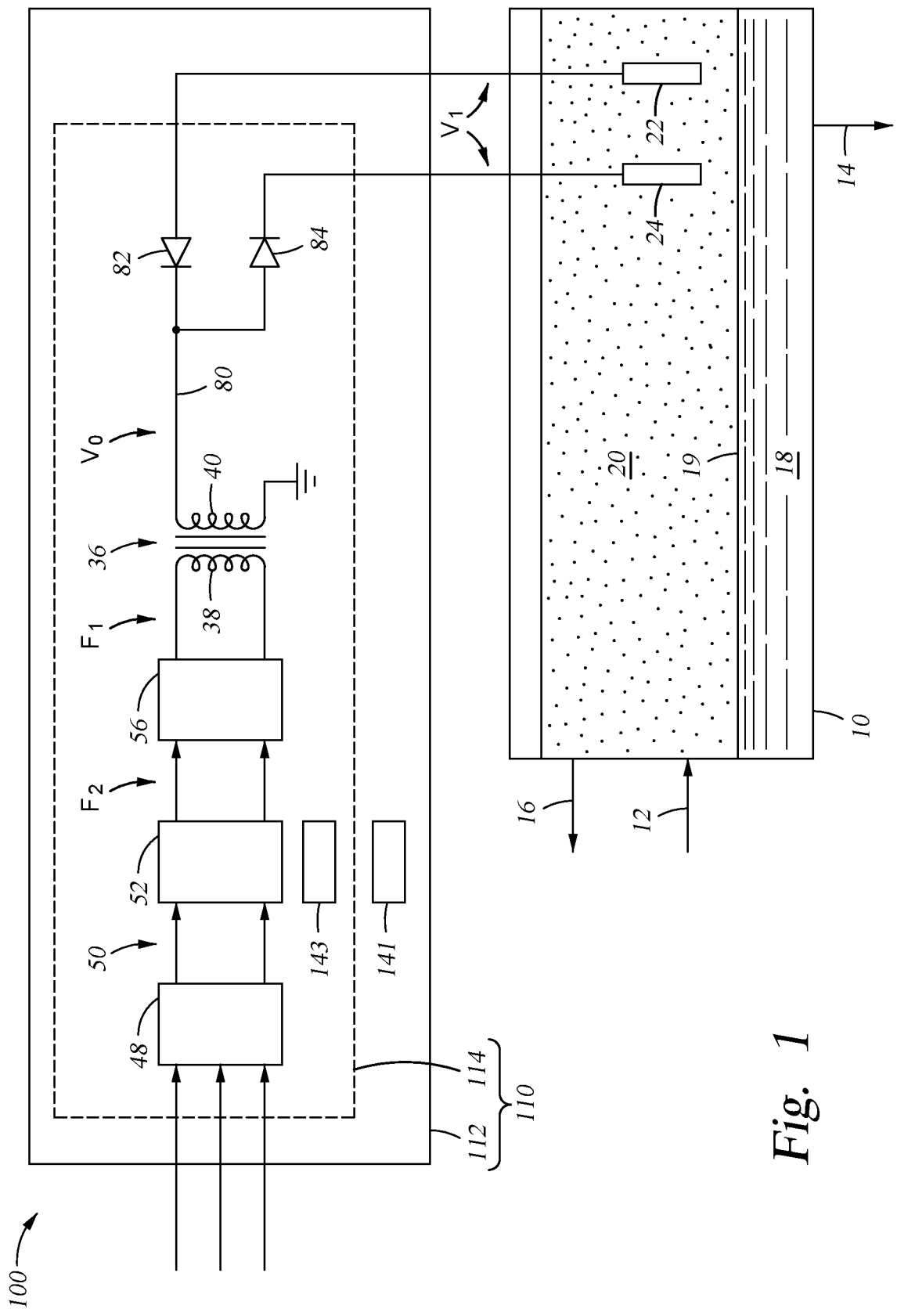
FIG. 1 is a schematic diagram of a system for electrical coalescence of a multi-phase liquid mixture, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electrodes are installed in a vessel containing a multi-phase liquid mixture, and are connected to a power supply device that outputs a voltage to cause electrical coalescence of the multi-phase liquid mixture in the vessel. The power supply device is provided in a housing outside the vessel, and is electrically connected, by a high voltage cable assembly, to the electrodes in the vessel to deliver the output voltage for electrical coalescence of the multi-phase liquid mixture in the vessel. If a fault is detected in operation of the power supply device, it is desirable to access whether the fault is inside the vessel or at the power supply device. In other approaches, to determine the location of the fault, the power supply device has to be isolated from the vessel by physically disconnecting the high voltage cable assembly. This work at the field requires a specialized technician with an appropriate permission and tools, and may take a day to a week to carry out a simple troubleshooting task.

In some embodiments, an output switch is provided between a high voltage output inside a housing of the power supply device and a terminal on an outer wall of the housing. The output switch is accessible and operable from outside the housing to disconnect the high voltage output from the terminal. As a result, the power supply device is electrically isolated from the vessel, without having to physically disconnect the high voltage cable assembly which may remain connected to the terminal on the outer wall of the housing of the power supply device. Time and labor for troubleshooting are therefore reduced, compared to the other approaches. In at least one embodiment, the output switch has a position where the high voltage output is grounded, to replicate a fault situation for testing purposes.

FIG. 1 is a schematic diagram of a system 100 for electrical coalescence of a multi-phase liquid mixture, in accordance with some embodiments. An example of a multi-phase liquid mixture is an emulsion. The system 100 includes a vessel 10 having an emulsion inlet 12, a first outlet 14, and a second outlet 16. A first phase separated from the multi-phase liquid mixture in the vessel 10 exits through the first outlet, and a second phase exits through the second outlet. The system 100 further includes a plurality of electrodes 22, 24 arranged in the vessel 10, and a power supply device 110 electrically coupled to the electrodes 22, 24 for applying an output voltage V1 to the electrodes 22, 24 for causing electrical coalescence of the multi-phase liquid mixture in the vessel 10. In operation, the multi-phase liquid mixture is provided to the vessel 10 at the inlet 12 and flows through the vessel while separating into the first phase and the second phase by operation of the electric fields produced by the electrodes 22 and 24, and also by the effect of gravity in some cases.

In some embodiments, the multi-phase liquid mixture is of produced water dispersed in crude oil and coalescence is used to augment the separation of the crude oil from the produced water. In the example configuration in FIG. 1, water is a heavier component 18 and is discharged through the heavier component outlet 14, whereas oil is a lighter component 20 and is discharged through the lighter component outlet 16. In another example (not shown), the crude oil is a heavy oil multi-phase liquid mixture in which the emulsified water component is lighter than the hydrocarbon component. In such example, water is the lighter component and is discharged through the lighter component outlet 16, whereas oil is the heavier component and is discharged through the heavier component outlet 14. Although embodiments specifically described herein are directed to coalescence of crude oil, other multi-phase liquid mixtures having heavier and lighter components to be separated by coalescence are within the scopes of various embodiments.

In some embodiments, the electrodes 22, 24 are perforated and are positioned within the vessel 10 so that the multi-phase liquid mixture supplied from the emulsion inlet 12 passes through and between the electrodes 22, 24. The output voltage V1 applied from the power supply device 110 to the electrodes 22, 24 forms an electric field above an oil/water interface 19 for causing electrical coalescence of the multi-phase liquid mixture for augmenting the separation of heavier and lighter components of the multi-phase liquid mixture. In at least one embodiment, the vessel 10 is grounded. The number and/or arrangement of the electrodes 22, 24 in the vessel 10 and/or the number of the power supply device(s) 110 are examples, and other configurations are within the scopes of various embodiments. For example, in at least one embodiment, more than one power supply devices 110 are respectively coupled to multiple sets of electrodes in a single vessel 10. Additionally, although the electrodes 22 and 24 are shown here in a vertical orientation, the electrodes can be arranged horizontally, or can be angled, and may have different orientations. Finally, although two electrodes are shown here, any number of electrodes can be used.

The power supply device 110 includes a housing 112 accommodating therein a power conversion circuit 114, a controller 141, and a plurality of sensors 143. In an example configuration, the power conversion circuit 114 and the controller 141, e.g., a microprocessor, are incorporated in the same board, e.g., a printed circuit board (PCB). In another example configuration, the power conversion circuit 114 and the controller 141 are formed in different PCBs. The PCBs are coupled to each other and are accommodated inside the same, common housing 112 of the power supply device 110. In the example configuration in FIG. 1, the power conversion circuit 114 includes a rectifying circuit (or rectifier) 48, a modulating circuit (or modulator) 52, a chopper circuit (or chopper) 56, a transformer 36 having a primary winding 38 and a secondary winding 40, and an output rectifier formed by diodes 82, 84. The sensors 143 are distributed at various electrical/electronic components of the power conversion circuit 114 and/or various locations in the housing 112, to provide the controller 141 with sensor data. Examples of sensor data include, but are not limited to, voltage and/or current feedbacks from one or more of the input voltage and the power conversion circuit, oil temperature and/or pressure and/or level in an oil-filled tank housing high voltage components as described herein, temperatures of dry electronics of the power conversion circuit, states of an output switch as described herein.

An input voltage, e.g., a single-phase or a three-phase voltage, is input into the rectifier 48 which is configured to output a rectified voltage on a DC bus 50 coupled to an output of the rectifier 48. In an example, the rectifier 48 includes a rectifying a bridge circuit of diodes. When the input voltage is a three-phase voltage, the bridge circuit is a three-phase bridge circuit.

Figure 2A:
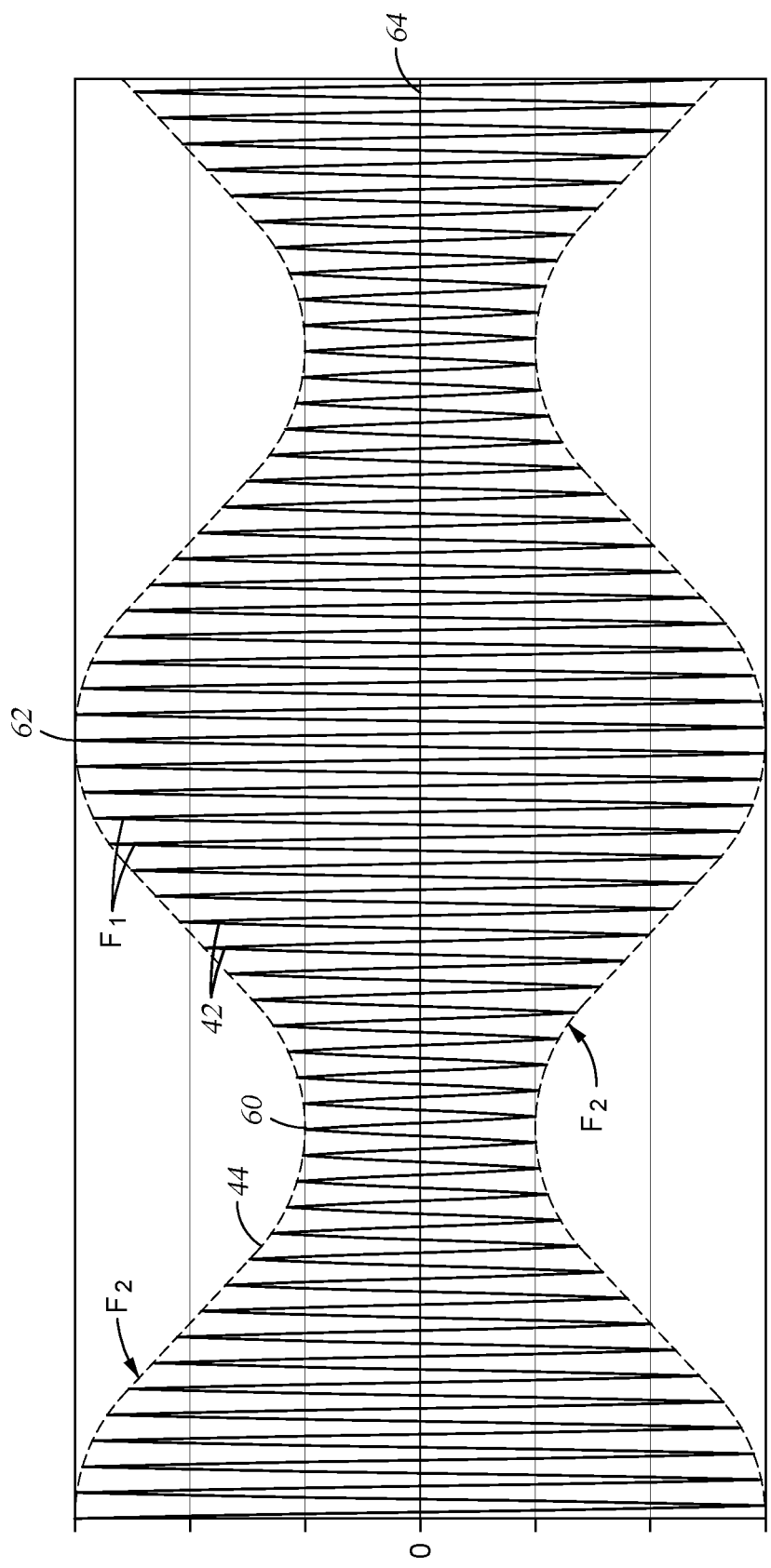
FIGS. 2A-2C are example waveforms of several voltages in the system of FIG. 1.

The modulator 52 is coupled to the output of the rectifier 48 through the DC bus 50, and is configured to modulate the rectified voltage in accordance with a modulation frequency signal (e.g., at a modulation frequency $F_2$) to obtain a modulated voltage. In an example, the modulator 52 includes one or more diodes and/or switching elements (or switches) and/or inductors. Examples of switches include, but are not limited to, IGBT (insulated-gate bipolar transistor), BJT (bipolar junction transistor), MOSFET (metal oxide field effect transistor), thyristor, GTO (gate turn-off thyristor), etc. The switches are controlled to be ON or OFF by the controller 141 to perform signal modulation on the rectified voltage to output the modulated voltage. An example waveform 44 of the modulated voltage having the modulation frequency $F_2$ is shown in FIG. 2A.

The chopper 56 is coupled to the output of the modulator 52, and configured to chop-up the modulated voltage in accordance with a base frequency signal (e.g., at a base frequency $F_1$) to obtain a chopped-up voltage. The base frequency is higher than the modulation frequency. In an example, the chopper 56 includes one or more switching elements (or switches). Examples of switches include, but are not limited to, IGBT, BJT, MOSFET, thyristor, GTO, etc. The switches are controlled to be ON or OFF by the controller 141 to chop-up the modulated voltage to output the chopped-up voltage. An example waveform 42 of the chopped-up voltage having the base frequency $F_1$ is shown in FIG. 2A.

Figure 2B:
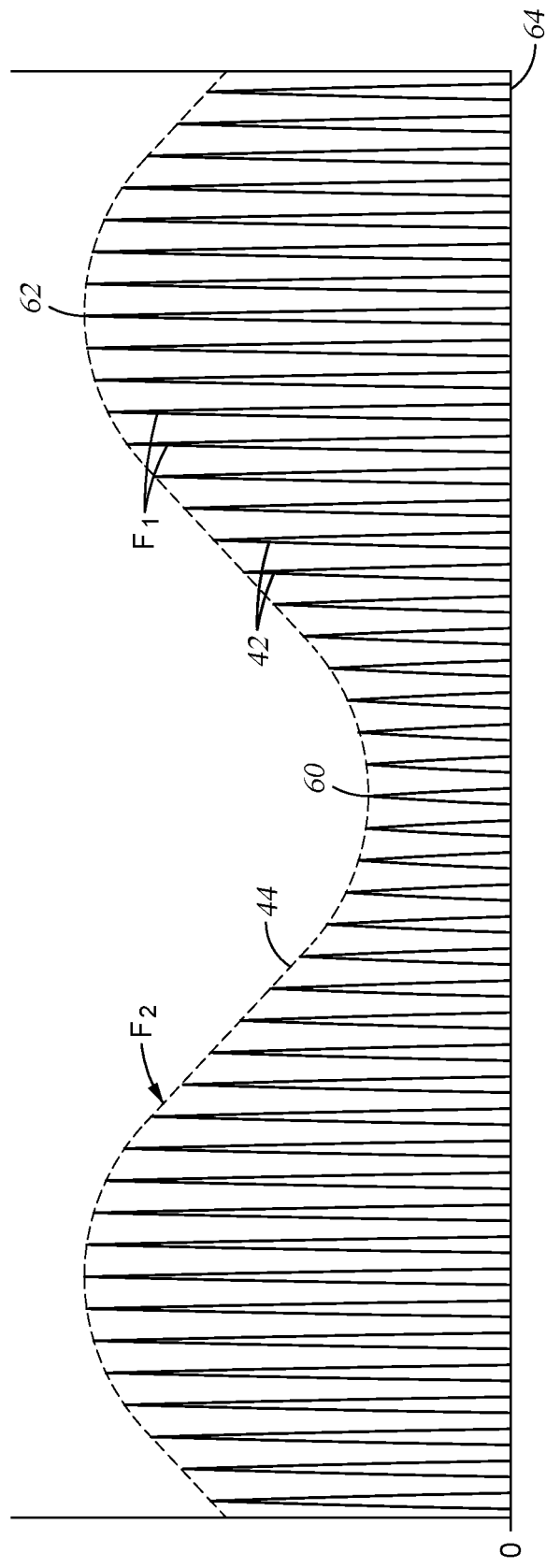
Figure 2C:
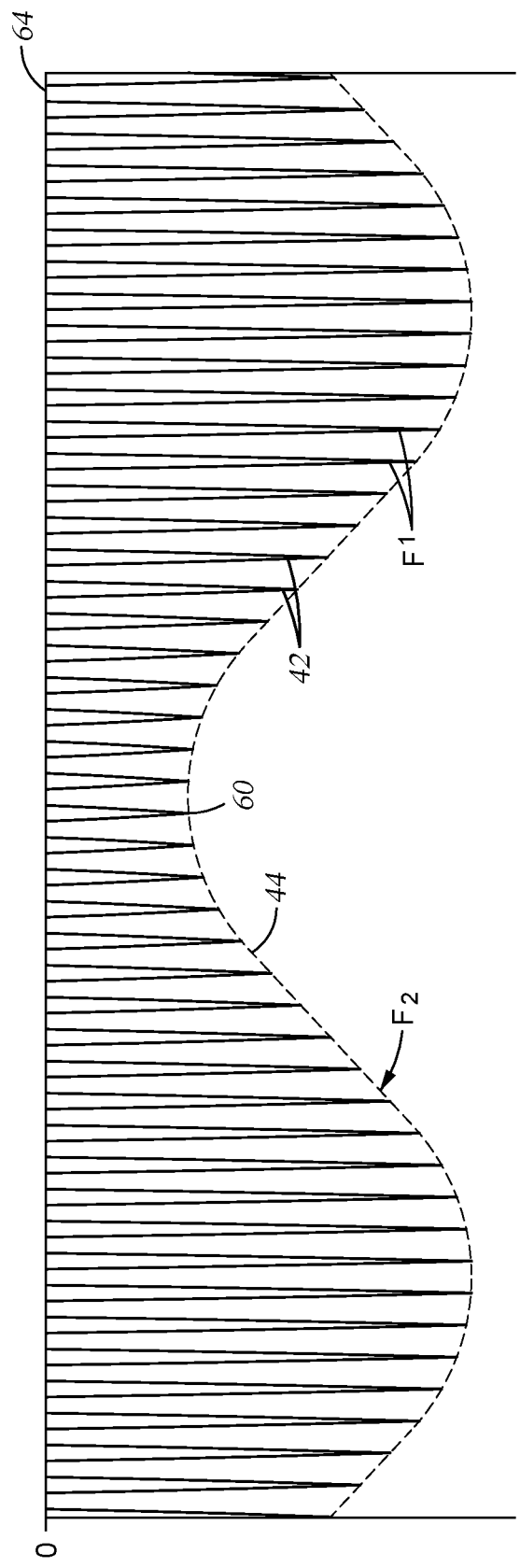

The primary winding 38 of the transformer 36 is coupled to the output of the chopper 56 to receive the chopped-up voltage. The chopped-up voltage is stepped up on the secondary winding 40 of the transformer 36, at an output 80, as an output voltage V0. The output voltage V0 is routed through an output rectifier formed by diodes 82, 84, to form the voltage V1, which is supplied to the corresponding electrodes 22, 24 in the vessel 10, to cause electrical coalescence of the multi-phase liquid mixture in the vessel 10. Example waveforms of the voltage V1 applied to the electrodes 24, 22, via diodes 84, 82, respectively, are shown in FIGS. 2B, 2C, respectively. In at least one embodiment, the output rectifier including the diodes 82, 84 is omitted, and a single electrode, or a single set of electrically connected electrodes, is electrically coupled to the output 80.

In some embodiments, the controller 141 includes a processor, a memory and a network and/or I/O interface for data exchange with other equipment. An example configuration of the controller 141 is given in FIG. 5 described herein. In at least one embodiment, the controller 141 includes a DSP (digital signal processor) or a microprocessor. The controller 141 is configured to control operation, for example, switching operation of various switches, in at least the modulator 52 and chopper 56, to obtain an intended waveform for the output voltage. Operation parameters used by the controller 141 to for operation control include, but are not limited to, base frequency $F_1$, modulation frequency $F_2$, minimum amplitude 60, maximum amplitude 62, and shape of the waveform 44 of the modulated voltage. The base frequency $F_1$ is the minimum frequency required to prevent the full discharge of dispersed water droplets. The modulation frequency $F_2$ is the natural frequency of the largest water droplet that will form at the minimum amplitude 60 of the output voltage. The minimum amplitude 60 is related to a threshold voltage 64 (FIG. 2A) and is the lowest voltage applied to the electrodes at the modulation frequency $F_2$. The threshold voltage 64 is the lowest voltage level with sufficient energy to initiate coalescence of dispersed water from a multi-phase liquid mixture of oil and water. The maximum amplitude 62 is related to a critical voltage and is the highest voltage applied to the electrodes at the modulation frequency $F_2$. The critical voltage is the highest voltage which permits coalesced water droplets to separate. Exceeding the critical voltage results in a reduction in the water droplet diameters and stops separation of water from oil. The shape of the waveform 44 is not necessarily a sine wave as shown, but may be any other shapes including, but not limited to, square, trapezoidal, triangular, exponential, logarithmic, semi-circular, symmetrical, non-symmetrical shapes. The operation parameters depend on one or more characteristics of the multi-phase liquid mixture subject to electrical coalescence, and are adjustable either by/at the controller 141 or via control signals supplied to the controller 141. In an example, the modulation frequency $F_2$ is in a range of 1 to 100 Hz, the base frequency $F_1$ is in a range of 60 to 2500 Hz, a minimum amplitude of the output voltage is in a range of 10 kV to 20 kV, and a maximum amplitude of the output voltage is in a range of 25 kV to 60 kV.

Figure 3A:
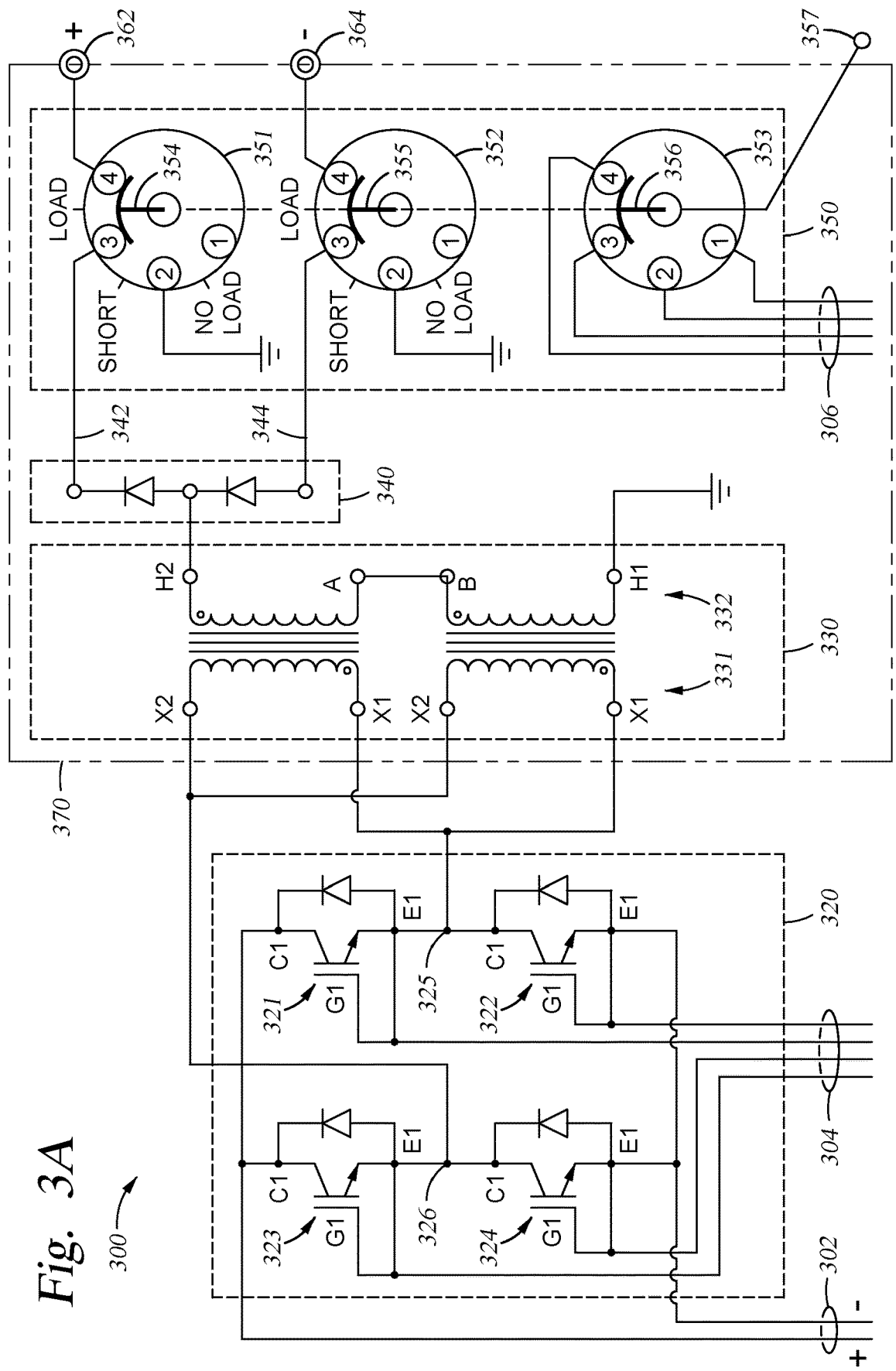
FIG. 3A is a circuit diagram of a part of a power supply device, in accordance with some embodiments.

FIG. 3A is a circuit diagram of a part of a power supply device 300, in accordance with some embodiments. In at least one embodiment, the power supply device 300 corresponds to the power supply device 110 of the system 100 in FIG. 1. In the part shown in the example configuration of FIG. 3A, the power supply device 300 includes a chopper 320, a transformer 330, an output rectifier 340, and an output switch 350. The power supply device 300 further includes a rectifier (not shown), a modulator (not shown), and a controller (not shown). The rectifier, modulator, chopper 320, transformer 330, and output rectifier 340 define a power conversion circuit corresponding to the power conversion circuit 114 described with respect to FIG. 1.

In some embodiments, the chopper 320 corresponds to the chopper 56 of the system 100. The modulator of the power supply device 300 supplies a modulated voltage 302 to the chopper 320 in a manner similar to the modulator 52 of the system 100. The chopper 320 includes a bridge circuit of four IGBTs 321, 322, 323, 324. Each of the IGBTs 321, 322, 323, 324 has a gate G1 coupled to an emitted E1, and a collector C1. The gate G1 and emitter E1 are further coupled to the controller, e.g., a DSP (or a microprocessor), of the power supply device 300 to receive gating signals 304 from the DSP.

The transformer 330 includes a primary winding 331 and a secondary winding 332. The primary winding 331 includes two coils. A first end X1 of each of the two coils of the primary winding 331 is coupled to a node 325 between the emitter of the IGBT 321 and the collector of the IGBT 322. A second end X2 of each of the two coils of the primary winding 331 is coupled to a node 326 between the emitter of the IGBT 323 and the collector of the IGBT 324. The secondary winding 332 includes first and second coils. An end A of the first coil is coupled to an end B of the second coil. The other end H2 of the first coil is coupled to a midpoint between two diodes of the output rectifier 340. The other end H1 of the second coil is grounded.

The output rectifier 340 includes two diodes coupled serially, in a manner similar to diodes 82, 84 in the power supply device 110. The nodes 342, 344 coupled to the output rectifier 340 define outputs of the power conversion circuit where the output voltage is generated.

The output switch 350 includes first through third contact sets 351, 352, 353, and a handle 357. Each of the first through third contact sets 351, 352, 353 includes a plurality of fixed contacts numbered as 1, 2, 3, 4, and a moving contact 354, 355, 356. The moving contacts 354, 355, 356 are physically coupled to the handle 357 to be moved together by a movement of the handle 357. The handle 357 is located outside a housing of the power supply device 300, and configured to be operated by a human operator to switch the output switch 350. In an example, the output switch 350 is a manual switch, and the handle 357 is configured to be moved manually by a human. In a further example, the output switch 350 is a power-assisted switch, and the handle 357 is configured to be moved by an actuator alone, or by both an actuator and a human. Examples of actuators include, but are not limited to, an electric motor, and an air cylinder. In yet another example, the output switch 350 is an electronic switch, such as, a relay. In at least one embodiment, the operation of the actuator is independent from the DSP. In other words, the DSP is not configured or coupled to automatically control the actuator to switch the output switch 350 without human triggering action. In the example configuration in FIG. 2, the high voltage components of the power supply device 300, for example, the transformer 330, the output rectifier 340 and the first through third contact sets 351, 352, 353, are accommodated in a tank 370 filled with oil. The handle 357 extends from within the tank 370 to an outside of the tank to be accessed and operated by a human operator, to switch the output switch 350 through a plurality of states, including, but not limited to, a load state, a short-circuit state, and a no-load state. In at least one embodiment, the actuator is remotely and/or automatically controllable.

In the load state shown in FIG. 3A, the moving contacts 354, 355, 356 are in a first physical position and electrically connect the fixed contacts numbered 3 and 4 of the first through third contact sets 351, 352, 353. The fixed contacts numbered 3 of the first and second contact sets 351, 352, are respectively coupled to the nodes 342, 344 of the power conversion circuit. The fixed contacts numbered 4 of the first and second contact sets 351, 352, are respectively coupled to positive and negative terminals 362, 364, exposed on an outer wall of the tank 370 for electrical connection to electrodes in a vessel. This is a normal operation state in which the output voltage at the output rectifier 340 is supplied to the terminals 362, 364 to be further supplied to corresponding electrodes in a vessel with a multi-phase liquid mixture to be treated. A state signal 306 indicating the load state is generated by the connection between the fixed contacts numbered 3 and 4 of the third contact set 353, and is supplied to the DSP.

When the handle 357 is operated, the moving contacts 354, 355, 356 are moved, e.g., rotated counterclockwise, to a second physical position and electrically connect the fixed contacts numbered 2 and 3 of the first through third contact sets 351, 352, 353. This is the short-circuit state in which the nodes 342, 344 of the power conversion circuit are grounded, via the grounded fixed contacts numbered 2 of the first and second contact sets 351, 352. The power conversion circuit of the power supply device 300 remains connected to the input voltage and operates as in the normal operation. A purpose of this short-circuit state is to replicate a fault on the load side, e.g., in the vessel, for testing purposes. For example, if the DSP detects a short-circuit at the outputs of the power conversion circuit and/or reacts as expected or designed, the fault was likely to occur in the vessel; otherwise, the fault was likely to occur in the power supply device 300. A signal indicating the short-circuit state is generated by the connection between the fixed contacts numbered 2 and 3 of the third contact set 353, and is supplied to the DSP.

When the handle 357 is further operated, the moving contacts 354, 355, 356 are moved, e.g., rotated further counterclockwise, to a third physical position and electrically connect the fixed contacts numbered 1 and 2 of the first through third contact sets 351, 352, 353. This is the no-load state in which the nodes 342, 344 of the power conversion circuit are electrically isolated both from the ground and from the terminals 362, 364. In other words, the power conversion circuit is electrically and physically isolated from the corresponding electrodes in the vessel. The power supply device 300 is shut down and/or controlled by the DSP to run through one or more tests. Trouble-shooting or maintenance is performed in the vessel or in the power supply device 300. A test described with respect to the short-circuit state may have already revealed whether the fault detected during normal operation occurred in the vessel or in the power supply device 300. A signal indicating the no-load state is generated by the connection between the fixed contacts numbered 1 and 2 of the third contact set 353, and is supplied to the DSP. In some embodiments, the output rectifier 340 is omitted, and the output of the power conversion circuit includes one node 342 or 344, the power supply device 300 has one terminal 362 or 364, and one of the first and second contact sets 351, 352 is omitted.

Figure 3B:
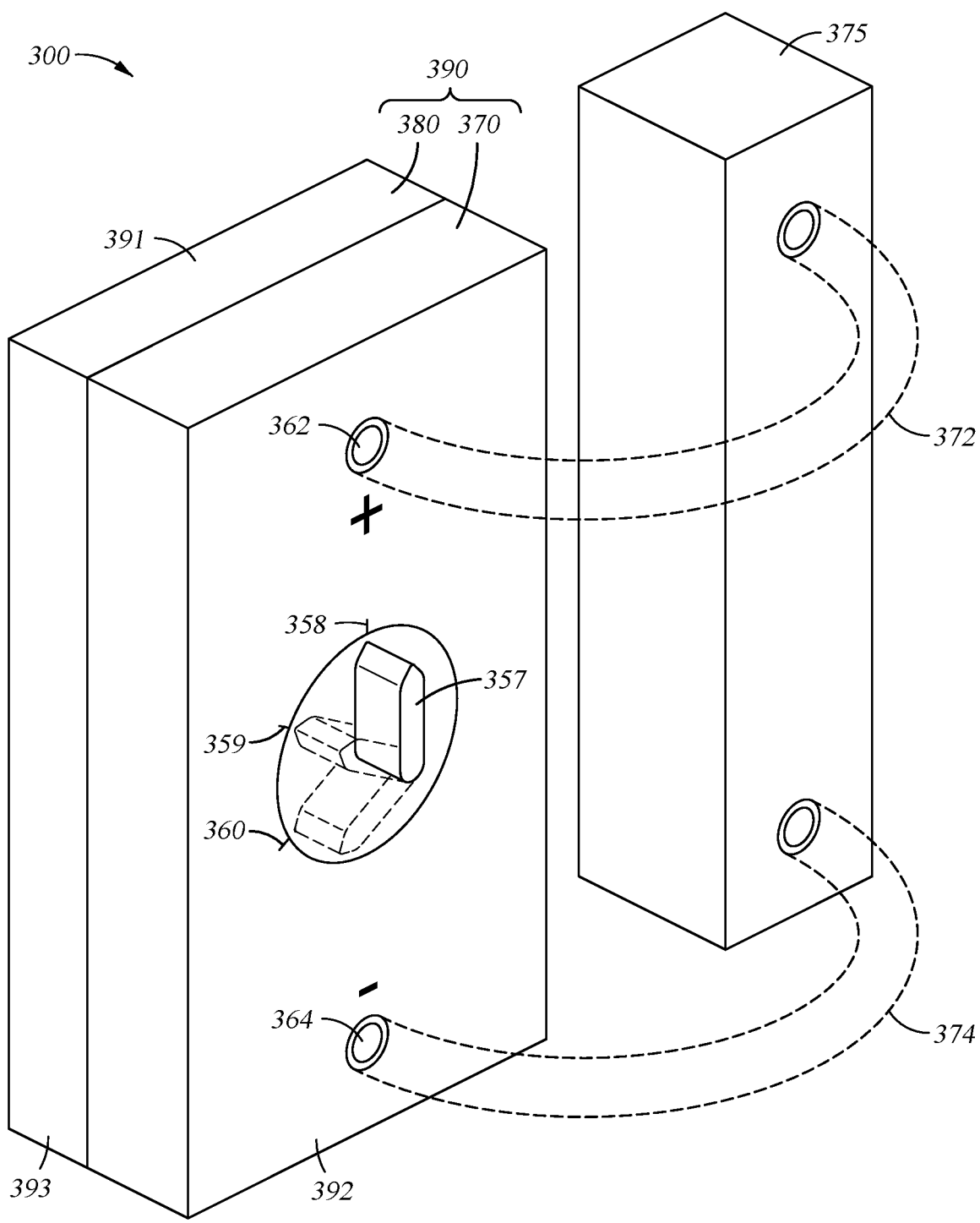
FIG. 3B is a schematic perspective view of the power supply device of FIG. 3A.

FIG. 3B is a schematic perspective view of the power supply device 300 of FIG. 3A. The power supply device 300 includes a housing 390 in which the power conversion circuit, DSP, sensors, and contacts of the output switch 350 are accommodated. The housing 390 includes a first part corresponding to the oil-filled tank 370 in which the high voltage components and corresponding sensors are accommodated, and a second part 380 in which the remaining components, also referred to as dry electronics, are accommodated. The housing 390 has a number of outer walls 391, 392, 393. The terminals 362, 364 and the handle 357 are arranged and exposed and on an outer wall, such as, 392. The terminals 362, 364 are electrically coupled, by high voltage cables 372, 374 to electrodes inside a vessel 375. The handle 357 is physically movable among a plurality of physical and visually distinguishable positions on the outer wall, a load position 358, a short position 359, and a no-load position 360. The positions may be labeled on the outer wall to visually indicate to an operator a status of the output switch 350. In an example embodiment, the handle 357 is arranged on a different outer wall, such as, 391 or 393, from the outer wall 392 on which the terminals 362, 364 are arranged.

In some embodiments, use of the output switch 350 with a no-load state permits simple and quick electrical isolation of the high voltage output of the power supply device 300 from electrodes in the vessel 375 for maintenance or troubleshooting, without requiring a special tool, technician or permit, and without having to physically disconnect the high voltage cables 372, 374 from the terminals 362, 364. This is an improvement, in terms of saved time and/or labor, over other approaches in which a specialized technician and/or special tools are required to isolate a power supply device from a vessel.

In some embodiments, use of the output switch 350 with a short-circuit state permits a quick and simple replication of a fault in the vessel 375, to determine whether a fault detected during normal operation occurred in the vessel 375 or in the power supply device 300. This is also an improvement in terms of saved time and/or labor.

In an aspect, although some embodiments described herein are directed to a power conversion circuit in which an AC-DC conversion is performed, in other embodiments such AC-DC conversion is omitted. In other words, an AC power supply voltage is directly modulated by the power conversion circuit, under control of a microprocessor, to provide an output voltage suitable for causing electrical coalescence of a multi-phase liquid mixture. The provision of an output switch as described herein, on the secondary side of a transformer of a power supply device for electrical coalescence of a multi-phase liquid mixture is a unique feature compared to other approaches.

In a further aspect, although some embodiments described herein are directed to an output switch that includes fixed contacts and moving contacts, as well as physical movements of the moving contacts relative to the fixed contacts, other embodiments are not so limited. For example, the output switch may include one or more semiconductor elements in which the switching among various positions as described herein can be made without moving parts.

Figure 4:
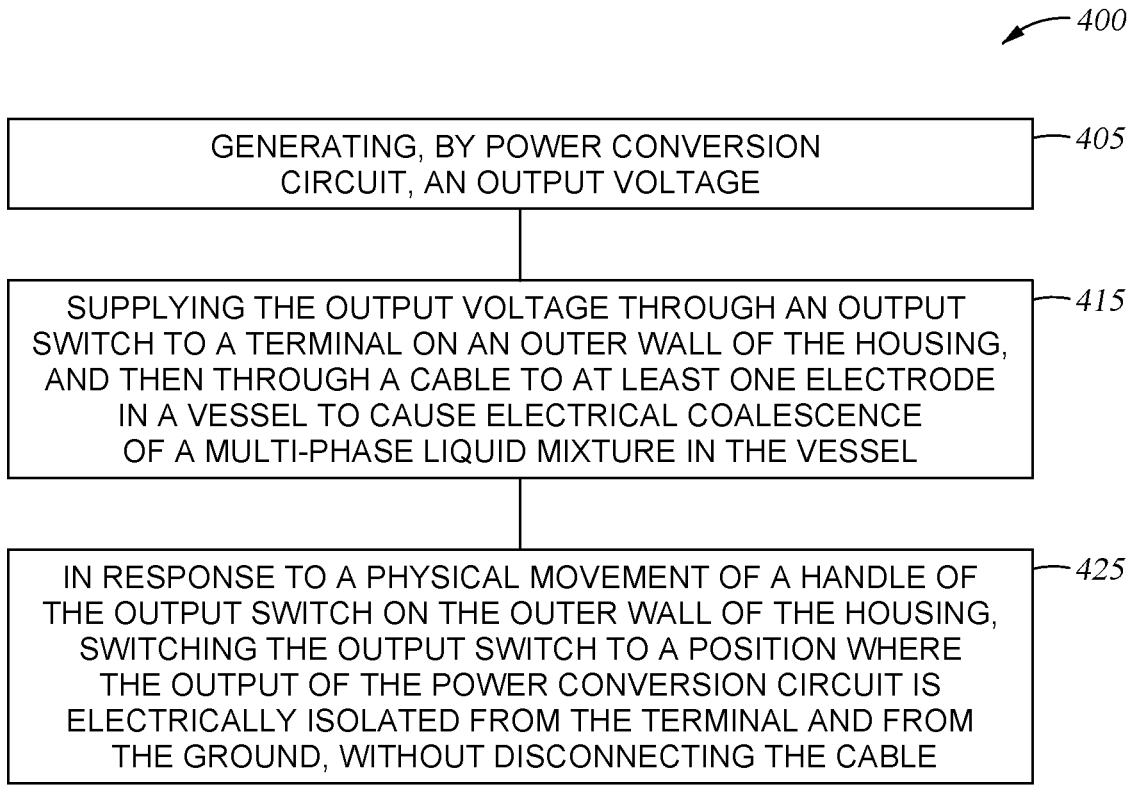
FIG. 4 is a flow chart of a method of operating a system for electrical coalescence of a multi-phase liquid mixture, in accordance with some embodiments.

FIG. 4 is a flow chart of a method 400 of operating a system for electrical coalescence of a multi-phase liquid mixture, in accordance with some embodiments. The method 400 may be performed in the system 100, and/or by one or more of the power supply device 110, 300, and/or under control of the controller 141.

At operation 405, a power conversion circuit generates an output voltage. For example, the power conversion circuit in the power supply device 110 or 300 described with respect to FIGS. 1, 3A and 3B generates an output voltage as described with respect to FIGS. 2A-2C.

At operation 415, the generated output voltage is supplied through an output switch to a terminal, and then through a cable to electrodes arranged in a vessel to cause electrical coalescence of a multi-phase liquid mixture in the vessel. For example, the generated output voltage is supplied, through the output switch 350 in a load position, to the terminals 362, 364 on the outer wall 392 of the housing 390 of the power supply device 300. The output voltage is then supplied, through cables 372, 374 connected to the terminals 362, 364, to electrodes in the vessel 375 for treating a multi-phase liquid mixture in the vessel, as described with respect to FIGS. 1, 3A and 3B.

At operation 425, when a handle of the output switch on the outer wall of the housing is physically moved, the output switch is switched to a position where the output of the power conversion circuit is electrically isolated from the terminal and from the ground. For example, when it is necessary to isolate the power supply device 300 from vessel 375, the handle 357 of the output switch 350 is physically moved to a no-load position, to electrically isolate the power conversion circuit from the ground and from the electrodes in the vessel 375, while the cables 372, 374 remain connected between the terminals 362, 364 and the electrodes. In at least one embodiment, a further physical movement of the handle 357 switches the output switch 350 to a short-circuit position where the output of the power conversion circuit is grounded for testing.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 5:
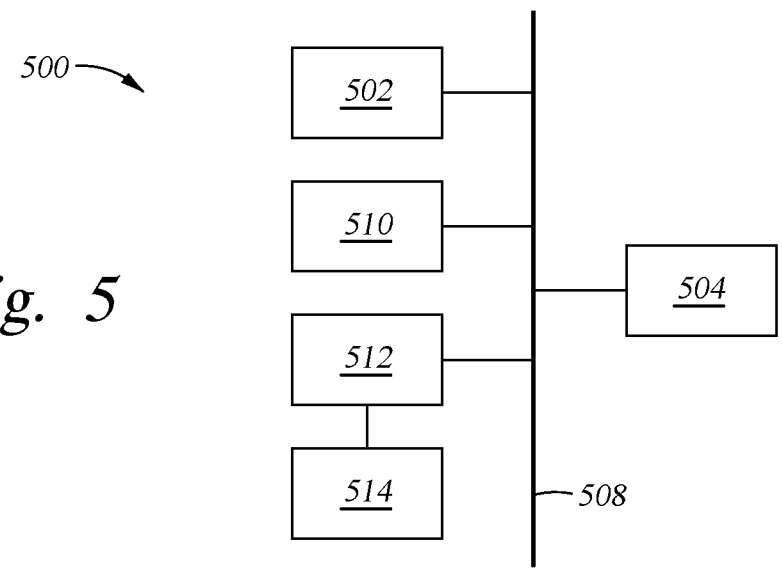
FIG. 5 is a block diagram of a controller, in accordance with some embodiments.

FIG. 5 is a block diagram of a controller, in accordance with some embodiments. The controller 500 comprises a hardware processor 502, a storage device 504 including at least one non-transitory, computer readable storage medium, a bus 508, an I/O (input/output) interface 510, and a network interface 512. The processor 502 is coupled with the storage device 504, the I/O interface 510, and the network interface 512 via the bus 508. The network interface 512 is connectable to a network 514, so that the processor 502 and the storage device 504 are communicable with other devices via the network 514.

The processor 502 is configured to execute computer program instructions encoded in the storage device 504 and/or to access data stored in the storage device 504 to cause the controller 500 to perform one or more functionalities and/or operations described with respect to FIGS. 1-4. The processor 502 includes one or more of a central processing unit (CPU), a multi-processor, a distributed processing system, an application specific integrated circuit (ASIC), and/or a suitable hardware processing unit.

The storage device 504 includes one or more of an electronic, magnetic, optical, electromagnetic, infrared, and/or a semiconductor system (or apparatus or device) for storing instructions and/or data in a non-transitory manner. For example, the storage device 504 includes a semiconductor or solid-state memory, a magnetic tape, a removable computer diskette, a random access memory (RAM), a read-only memory (ROM), a rigid magnetic disk, and/or an optical disk. As examples of optical disks, storage device 504 includes a compact disk-read only memory (CD-ROM), a compact disk-read/write (CD-R/W), and/or a digital video disc (DVD).

The I/O interface 510 is circuitry that is connectable with external circuitry. For example, the I/O interface 510 includes one or more of a keyboard, keypad, mouse, trackball, trackpad, cursor direction keys, card reader, communication port, display, signal light, printer and/or audio device for communicating information to/from the processor 502. In an example, the I/O interface 510 is omitted.

The network interface 512 is circuitry that allows the controller 500 to communicate with the network 514, to which one or more other controllers and/or equipment are connected. For example, the network interface 512 includes one or more of wireless network interfaces such as BLUETOOTH, WIFI, WIMAX, GPRS, or WCDMA; or wired network interface such as Modbus, TCP/IP, ETHERNET, USB, or IEEE-1394. In an example, the network interface 512 is omitted.

By being configured to execute some or all of functionalities and/or operations described with respect to FIGS. 1-4, the controller 500 enables the realization of one or more advantages and/or effects described with respect to FIGS. 1-4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A power supply device, comprising:
a power conversion circuit configured to convert an input voltage into an output voltage;
a controller coupled to the power conversion circuit and configured to control the power conversion circuit to generate the output voltage for causing electrical coalescence of a multi-phase liquid mixture when the output voltage is applied to the multi-phase liquid mixture; and
an output switch coupled between an output of the power conversion circuit and a terminal of the power supply device, said output switch having
a first position wherein the output of the power conversion circuit is coupled to the terminal, a second position wherein the output of the power conversion circuit is grounded, and a third position wherein the output of the power conversion circuit is electrically isolated from the terminal and the ground.

2. The power supply device of claim 1, wherein
the output switch is configured to output a signal to the controller to indicate a state of the output switch as being at the first position, the second position, or the third position.

3. The power supply device of claim 1, wherein
the controller is configured to control the power conversion circuit to generate the output voltage while the output switch is in the second position where the output of the power conversion circuit is grounded, to replicate a fault situation for testing.

4. The power supply device of claim 1, wherein the output switch is a manual switch.

5. The power supply device of claim 1, wherein the output switch is a power-assisted switch.

6. The power supply device of claim 1, wherein
the output switch comprises a first contact set, a second contact set, and a handle, each of the first and second contact sets includes:
fixed contacts corresponding to the first position, the second position, and the third position of the output switch; and
a moving contact physically movable among the first position, the second position, and the third position,
the fixed contacts of the first contact set include a first fixed contact, a second fixed contact, and a third fixed contact coupled to the terminal, the output of the power conversion circuit, and the ground, respectively,
the fixed contacts of the second contact set include a first fixed contact, a second fixed contact, and a third fixed contact corresponding to the first fixed contact, the second fixed contact, and the third fixed contact of the first contact set, respectively, and
the moving contacts of the first contact set and the second contact set are coupled to the handle to be physically moved together by a physical movement of the handle.

7. The power supply device of claim 6, wherein
at the first position,
the moving contact of the first contact set connects (i) the first fixed contact coupled to the terminal and (ii) the second fixed contact coupled to the output of the power conversion circuit, and
the moving contact of the second contact set connects the corresponding first fixed contact and the corresponding second fixed contact of the second contact set to indicate the first position of the output switch to the controller,
at the second position,
the moving contact of the first contact set connects (i) the second fixed contact coupled to the output of the power conversion circuit and (ii) the third fixed contact coupled to the ground, and
the moving contact of the second contact set connects the corresponding second fixed contact and the corresponding third fixed contact of the second contact set to indicate the second position of the output switch to the controller, and
at the third position,
the moving contact of the first contact set is free of physical and electrical contact with the second fixed contact coupled to the output of the power conversion circuit, and the moving contact of the second contact set is free of physical and electrical contact with the second fixed contact of the second contact set to indicate the third position of the output switch to the controller.

8. The power supply device of claim 7, wherein
the output of the power conversion circuit is a positive output,
the terminal of the power supply device is a positive terminal,
the power supply device further comprises a negative terminal,
the power conversion circuit further comprises a negative output corresponding to the negative terminal of the power supply device,
the output switch further comprises a third contact set, including
fixed contacts corresponding to the first position, the second position and the third position of the output switch, and
a moving contact physically movable among the first position, the second position and the third position,
the fixed contacts of the third contact set include a first fixed contact, a second fixed contact, and a third fixed contact coupled to the negative terminal, the negative output of the power conversion circuit, and the ground, respectively, and
the moving contacts of the first contact set, the second contact set, and the third contact set are coupled to the handle to be physically moved together by a physical movement of the handle.

9. The power supply device of claim 8, wherein
at the first position,
the moving contact of the third contact set connects (i) the first fixed contact coupled to the negative terminal and (ii) the second fixed contact coupled to the negative output of the power conversion circuit,
at the second position,
the moving contact of the third contact set connects (i) the second fixed contact coupled to the negative output of the power conversion circuit and (ii) the third fixed contact coupled to the ground, and
at the third position,
the moving contact of the third contact set is free of physical and electrical contact with the second fixed contact coupled to the negative output of the power conversion circuit.

10. The power supply device of claim 1, further comprising:
a tank containing oil,
wherein
the power conversion circuit comprises a transformer, a secondary winding of the transformer coupled to the output of the power conversion circuit,
the transformer, the output of the power conversion circuit and contacts of the output switch are submerged in the oil in the tank,
the output switch has a handle physically movable to switch the contacts of the output switch among the first position, the second position, and the third position, and
the handle of the output switch and the terminal are exposed on an outer wall of the tank and are accessible from outside the tank.

11. The power supply device of claim 10, wherein
the output of the power conversion circuit is a positive output, the terminal of the power supply device is a positive terminal,
the power supply device further comprises a negative terminal,
the power conversion circuit further comprises a negative output corresponding to the negative terminal of the power supply device, and
the handle of the output switch and the positive terminal and the negative terminal are exposed on the outer wall of the tank, and the handle of the output switch is arranged between the positive terminal and the negative terminal on the outer wall of the tank.

12. A system, comprising:
a housing;
a power conversion circuit accommodated in the housing, and configured to convert an input voltage into an output voltage for causing electrical coalescence of a multi-phase liquid mixture when the output voltage is applied to the multi-phase liquid mixture; and
an output switch, including:
 a fixed contact and a moving contact accommodated in the housing, and configured to connect or disconnect an output of the power conversion circuit and a terminal on an outer wall of the housing, and
 a physically movable handle exposed on the outer wall of the housing, and coupled to the moving contact for moving the moving contact relative to the fixed contact to switch the output switch between
  a load position at which the output of the power conversion circuit is coupled to the terminal, and
  a no-load position at which the output of the power conversion circuit is electrically isolated from the terminal and the ground.

13. The system of claim 12, further comprising:
a vessel;
at least one electrode in the vessel, the at least one electrode electrically coupled to the terminal exposed on the outer wall of the housing, for, in the load position of the output switch, receiving the output voltage generated by the power conversion circuit and causing electrical coalescence of the multi-phase liquid mixture in the vessel upon application of the output voltage to the at least one electrode,
wherein the vessel comprises
 an inlet for supplying the multi-phase liquid mixture into the vessel,
 a first outlet for discharging a heavier component of the multi-phase liquid mixture, and
 a second outlet for discharging a lighter component of the multi-phase liquid mixture.

14. The system of claim 12, wherein
the housing comprises a tank containing oil,
the power conversion circuit comprises a transformer, a secondary winding of the transformer coupled to the output of the power conversion circuit,
the transformer, the output of the power conversion circuit and the contacts of the output switch are submerged in the oil in the tank, and
the outer wall, on which is the handle of the output switch and the terminal are exposed, is an outer wall of the tank.

15. The system of claim 14, wherein
the output of the power conversion circuit is a positive output,
the terminal exposed on the outer wall of the tank is a positive terminal,
a negative terminal is further exposed on the outer wall of the tank,
the power conversion circuit further comprises a negative output corresponding to the negative terminal,
in the load position of the output switch, the positive output and the negative output of the power conversion circuit are coupled to the positive terminal and the negative terminal, respectively, and
in the no-load position of the output switch, the positive output and the negative output of the power conversion circuit are electrically isolated from the positive terminal and the negative terminal, respectively.

16. The system of claim 15, wherein
the handle of the output switch is exposed and arranged between the positive terminal and the negative terminal on the outer wall of the tank.

17. The system of claim 12, wherein
the output switch is switchable by a movement of the handle to a short-circuit position at which the output of the power conversion circuit is grounded to replicate a fault situation for testing.

18. The system of claim 17, wherein
the load position, the no-load position and the short-circuit position of the output switch correspond to three different physical and visually distinguishable positions of the handle on the outer wall of the housing, to visually indicate to an operator a status of the output switch.

19. A method, comprising:
generating, by a power conversion circuit accommodated in a housing, an output voltage;
supplying the output voltage
 through an output switch, which is in a first position, to a terminal on an outer wall of the housing, and then through a cable, which is coupled to the terminal, to at least one electrode in a vessel to cause electrical coalescence of a multi-phase liquid mixture in the vessel upon application of the output voltage; and
in response to a physical movement of a handle of the output switch on the outer wall of the housing, switching the output switch to a second position where the output of the power conversion circuit is electrically isolated from the terminal and from the ground, to electrically isolate the power conversion circuit from the at least one electrode in the vessel while the cable remains connected between the terminal and the at least one electrode.

20. The method of claim 19, further comprising:
in response to a further physical movement of the handle of the output switch on the outer wall of the housing, switching the output switch to a third position where the output of the power conversion circuit is grounded, to replicate a fault situation for testing.

* * * * *